US008110925B2

(12) United States Patent
Goebl et al.

(10) Patent No.: US 8,110,925 B2
(45) Date of Patent: Feb. 7, 2012

(54) POWER SEMICONDUCTOR COMPONENT WITH METAL CONTACT LAYER AND PRODUCTION METHOD THEREFOR

(75) Inventors: Christian Goebl, Nürnberg (DE); Peter Beckedahl, Oberasbach (DE); Heinrich Heilbronner, Stein (DE)

(73) Assignee: Semikron Elektronik GmbH & Co., KG, Nürnberg (DE)

( * ) Notice: Subject to any disclaimer, the term of this patent is extended or adjusted under 35 U.S.C. 154(b) by 250 days.

(21) Appl. No.: 12/220,826

(22) Filed: Jul. 28, 2008

(65) Prior Publication Data
US 2009/0039516 A1 Feb. 12, 2009

(30) Foreign Application Priority Data
Jul. 26, 2007 (DE) .......................... 10 2007 022 338

(51) Int. Cl.
H01L 23/48 (2006.01)
H01L 21/304 (2006.01)
(52) U.S. Cl. ...................................................... 257/762
(58) Field of Classification Search .................. 257/762,
257/7, 93, 334, 427, 444, 446, 491, 663,
257/713, 262, 368–401, E29.255–E29.313,
257/E29.315–E29.316, 135–136, 41, 81,
257/82, E23.078, 620, 91, 99, 177–182, 276,
257/457, 459, 502, 503, 573, 584, 602, 621,
257/664–677, 688–700, 734–736, E23.01–E23.079,
257/E23.141–E23.179; 437/216, 222, 901;
438/48–98, 135, 151, 197, 199, 201, 207,
438/216, 113, 114, 458, 460–465
See application file for complete search history.

(56) References Cited

U.S. PATENT DOCUMENTS

| 4,903,886 | A | * | 2/1990 | Schwarzbauer | 228/106 |
|---|---|---|---|---|---|
| 5,158,226 | A | | 10/1992 | Schwarzbauer | |
| 5,169,804 | A | | 12/1992 | Schwartzbauer | |
| 5,379,942 | A | | 1/1995 | Kuhnert et al. | |
| 5,807,626 | A | | 9/1998 | Naba | |
| 6,812,559 | B2 | | 11/2004 | Palm et al. | |
| 6,935,556 | B2 | | 8/2005 | Knapp | |
| 2003/0056981 | A1 | | 3/2003 | Furukuwa | |
| 2007/0065984 | A1 | * | 3/2007 | Lau et al. | 438/107 |
| 2007/0087480 | A1 | * | 4/2007 | Tao et al. | 438/112 |
| 2007/0183920 | A1 | * | 8/2007 | Lu et al. | 419/9 |
| 2009/0085195 | A1 | * | 4/2009 | Houle et al. | 257/707 |

FOREIGN PATENT DOCUMENTS

| DE | 34 15 065 | 12/1985 |
|---|---|---|
| DE | 42 33 073 | 4/1994 |
| DE | 100 62 108 | 6/2002 |

(Continued)

Primary Examiner — Dao H Nguyen
Assistant Examiner — Tram H Nguyen
(74) Attorney, Agent, or Firm — Roger S. Thompson

(57) ABSTRACT

A power semiconductor component having a basic body and at least one contact area. At least one first thin metallic layer of a first material is arranged on the contact area. A second metallic layer—thicker than the first—of a second material is arranged on the first material by a pressure sintering connection of said material. The associated method has the following steps: producing a plurality of power semiconductor components in a wafer; applying at least one first thin metallic layer on at least one contact area of a respective power semiconductor component; arranging a pasty layer, composed of the second material and a solvent, on at least one of the first metallic layers for each power semiconductor component; pressurizing the pasty layer; and singulating the semiconductor components.

7 Claims, 2 Drawing Sheets

FOREIGN PATENT DOCUMENTS

| | | |
|---|---|---|
| DE | 103 49 477 | 2/2005 |
| DE | 10 2004 019 567 | 1/2006 |
| EP | 0 460 286 | 12/1991 |
| EP | 0 477 600 | 4/1992 |
| EP | 1 280 196 | 1/2003 |

* cited by examiner

POWER SEMICONDUCTOR COMPONENT WITH METAL CONTACT LAYER AND PRODUCTION METHOD THEREFOR

BACKGROUND OF THE INVENTION

1. Field of the Invention

The invention is directed to a power semiconductor component with at least one contact metallization, and, more particularly, to such a component having a monocrystalline basic body and at least one pn junction. Power semiconductor components of this type are, for example, power diodes, power transistors or power thyristors, but also solar cells and resistance components.

2. Description of the Related Art

In a semiconductor device, contact metallization provides electrically conductively connecting contact areas to connect the semiconductor body to external connecting elements. Connecting elements of this type can be formed for example as wire bonding connections, substrates connected by soldering or pressure-contact-connected terminal elements.

The choice of which type of metallization to use depends upon the type of contact device with which the metallization is to be used, for example a wire bonding connection. Many different types of prior art contact metallizations are known. Therefore, multilayer contact metallizations constructed from a layer sequence of different metals are known especially in the field of power semiconductor components. Within these layer sequences, individual thicknesses of the respective layers are not identical, but often lie in the range of a few tenths of a micrometer to a few micrometers.

For use in pressure-contact-connected arrangements, it is also known to arrange a metal plate having a thickness on the order of magnitude of millimeters between the terminal element and the power semiconductor component. Such metal plates serve to reduce mechanical stresses in the power semiconductor component or the contact metallization thereof.

SUMMARY OF THE INVENTION

It is an object of the invention to provide a power semiconductor component in the area of the contact metallization in order that the contact properties thereof are improved, and to provide a method whereby the power semiconductor component may be produced simply.

The invention is directed to a power semiconductor component preferably having a monocrystalline basic body and at least one pn junction. The inventive power semiconductor component has at least one contact area in the region of the semiconductor body, wherein at least one first thin metallic layer of a first material is arranged on the contact area. Arranged on at least one of the first metallic layers is a metallic layer—thicker than the first—of a second material. It is preferred if the second metallic material has a proportion of more than 90 percent of a noble metal. It is particularly preferred if the noble metal is silver.

This arrangement is formed by a pressure sintering connection, where "pressure sintering connection" should be understood here to mean that a layer of a material is arranged by means of the method described below.

The inventive method for producing a power semiconductor component of this type has the following steps:
 producing a plurality of power semiconductor components in a wafer;
 applying at least one first thin metallic layer on at least one contact area of the respective power semiconductor components;
 arranging a pasty layer, composed of the second material and a solvent, on at least one of the first metallic layers for each power semiconductor component;
 pressurizing the pasty layer (in this case, it is preferred to drive out the majority of the solvent from the pasty layer before pressurization); and
 singulating the semiconductor components.

It may be preferred if the pasty layer is applied by means of stencil printing. This method provides the required positioning accuracy, with the required layer thickness, and can be realized cost-effectively.

A first advantageous embodiment of the pressurization of the pasty layer can be provided by the application of a press and two pressing rams. In this embodiment, it is additionally preferred if at least one pressing ram is formed with a quasi-hydrostatic pressure generating silicone pad arranged thereon.

A second advantageous embodiment of the pressurization of the pasty layer can be effected by the application of a pressure tank filled with a suitable fluid (liquid or gas). In this case, it is preferred to arrange the power semiconductor components in the wafer and covered by a film, preferably a Teflon film, in the pressure tank and subsequently to externally pressurize the liquid therein.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

DETAILED DESCRIPTION OF THE PRESENTLY PREFERRED EMBODIMENTS

Figure 1:
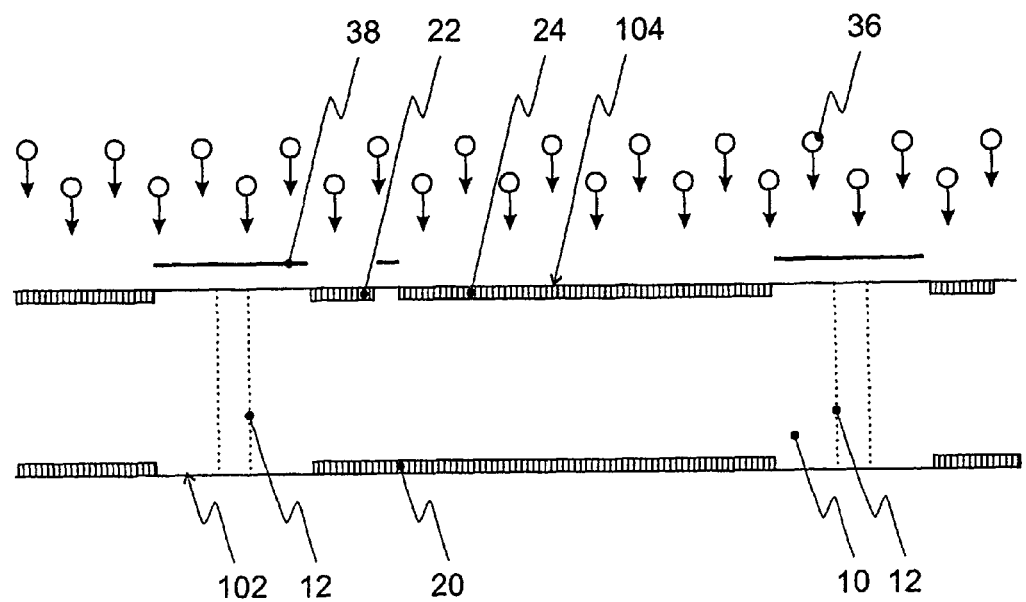
FIGS. 1 and 2 show individual steps of the inventive method for providing a first power semiconductor component according to the invention.
Figure 2:
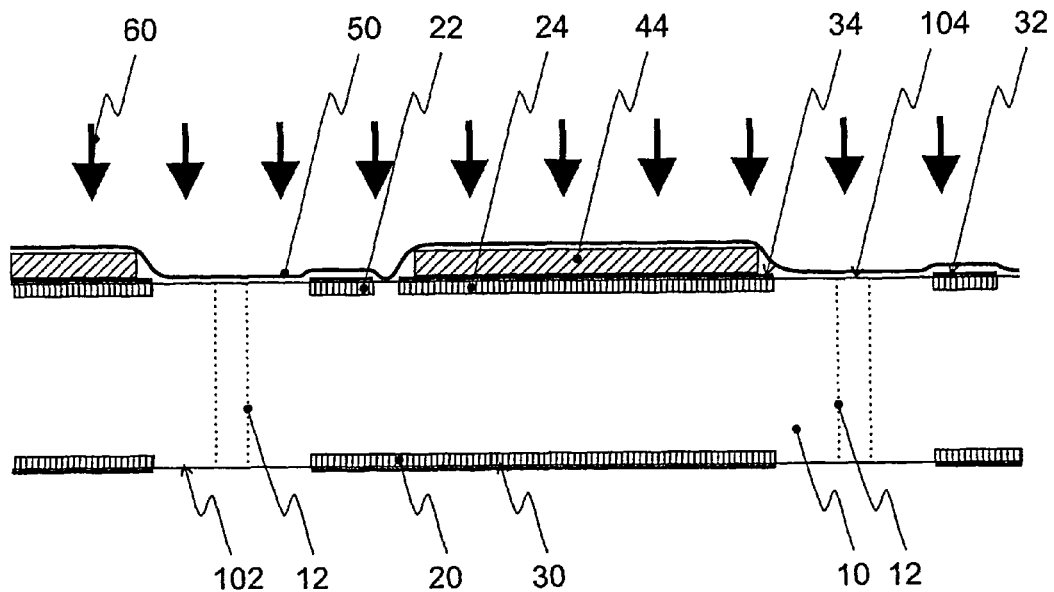

FIGS. 1 and 2 show individual steps of the production method for producing a first power semiconductor component.

FIG. 1 illustrates a semiconductor body with power semiconductor components 10 having edges 12 and a plurality of contact areas 20, 22, 24 on two main areas 102, 104 thereof. The production of a first thin layer of the first metallic material 36 is shown. This layer may be formed, as is known by, for example, vapor deposition via shadow masks 38 or sputtering. At least one homogeneous layer with a layer thickness on the order of magnitude of micrometers is deposited by means of these well known and understood methods. In this case, it may be preferred to form this layer of a plurality of thin individual layers, each composed of different metals, each having a different layer thickness.

Next, a pasty layer 44 (FIG. 2) is deposited on first layer 34, preferably by stencil printing, as in known sintering connections. In this case, it is irrelevant to the invention whether layers 34, 44 are arranged directly one above another or whether the pasty second layer 44 slightly covers or else incompletely covers first layer 34.

Pasty layer 44 itself comprises a mixture of a metallic material in the form of metal flakes having a maximum extent of the order of magnitude of micrometers and a solvent. A suitable material for the metal flakes is silver, in particular, but also other noble metals or mixtures having a noble metal proportion of more than about 90 percent.

FIG. 2 shows the pressurization (illustrated diagrammatically by arrows 60) of pasty layer 44 in order to form a second metallic layer thicker than the first. Additionally illustrated, and also preferred here, is a film 50, for example a Teflon film, which was applied before pressurization 60. In this case, it is preferred to cover the entire wafer with film 50. It is possible in some embodiments, however, to selectively cover only the portion of the wafer covered by pasty layer 44 with film 50.

In order to form a sufficiently adhering connection between pasty layer 44 and first metallic layer 34, it is preferred if the maximum final pressure introduced during the pressurization 60 corresponds to at least about 15 MPa.

Furthermore, it can be advantageous, in addition to pressurization 60, to heat power semiconductor component 10, or the semiconductor body, to more than about 350° K. This is advantageous for removing the solvent from pasty layer 44 since the finished metallic layer should not contain any solvent.

The said second layer has a preferred thickness of between about 10 μm and 80 μm after pressurization 60, wherein layers of between about 1 μm and about 250 μm can also be produced and are also expedient depending on the application.

Figure 3:
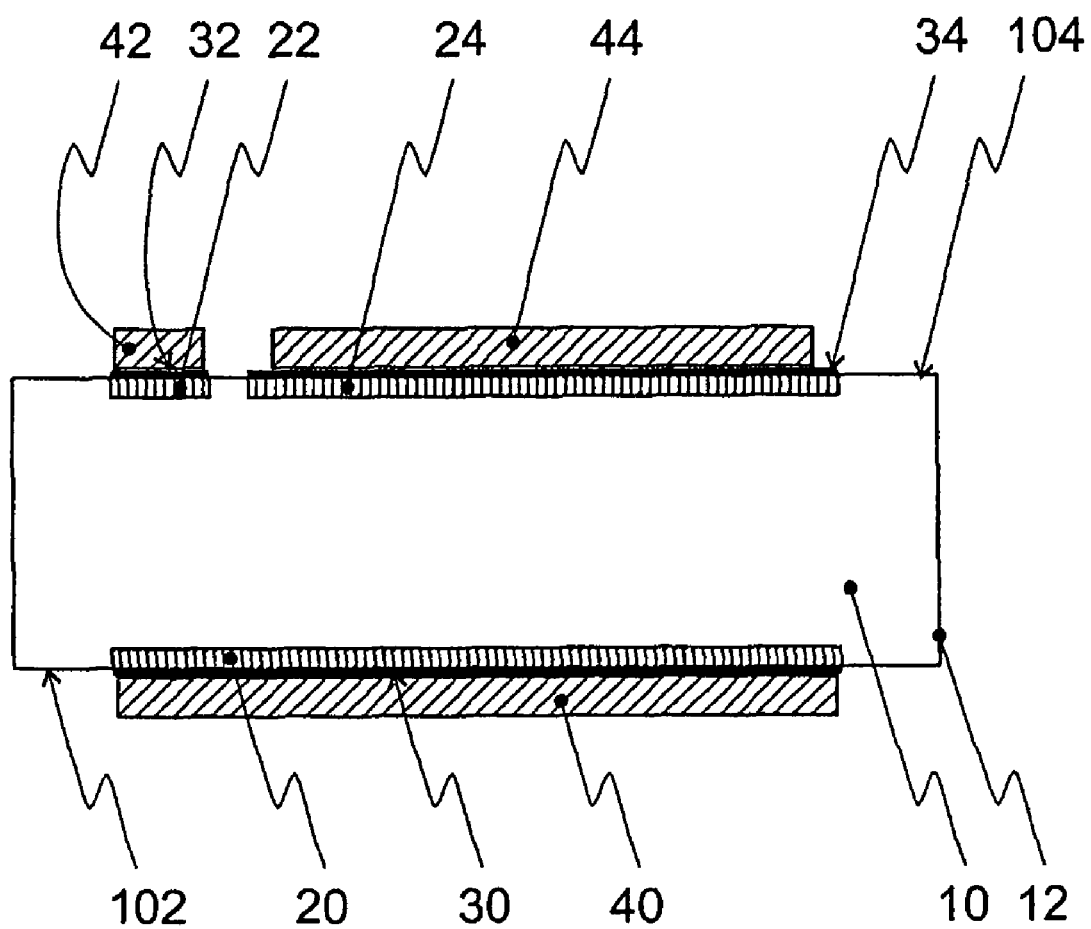
FIG. 3 shows a second power semiconductor component in accordance with the invention.

FIG. 3 shows a second power semiconductor component 10 according to the invention, here a power thyristor. The semiconductor body thereof has on its first main area 102 a first contact area 20, here a cathode, and at its second main area 104, two further contact areas 22, 24, a control input, the gate 22 and an anode 24. In this configuration, all these contact areas have been developed according to the invention.

Each contact area 20, 22, 24 has a first layer composed of a first metallic material 30, 32, 34, here partial layers of different materials with a last partial layer composed of silver and a total layer thickness of approximately 5 μm. The first material 30, 32, 34 is covered by a second metallic material 40, 42, 44 deposited by pressure sintering, here likewise silver with a layer thickness of 50 μm.

A power semiconductor component 10 formed in this way may be produced simply (cf. FIGS. 1 and 2). Additionally, a power semiconductor component 10 of this type can be used in a pressure-contact-connected construction without a further metallic plate having a thickness in the range of from about 0.2 mm to about 4 mm being arranged between the terminal element (not illustrated) and power semiconductor component 10 itself. The task of this plate is performed by the thick second metallic layer 40, 42, 44.

The advantages of a power semiconductor component according to the invention are magnified in combination with further connecting techniques. Especially for producing a sintering connection of power semiconductor component 10 to a substrate, it is necessary for power semiconductor component 10 to have a noble metal surface for connection. In addition, it is advantageous if the noble metal surface has a layer thickness of more than 10 μm. Layers of this type can be produced significantly more simply and more cost-effectively by the method described in comparison with production by means of standard methods, for example by means of vapor deposition or sputtering.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A method for producing a plurality of power semiconductor components each component having:
    a basic body;
    at least one contact area disposed on said body;
    at least one first thin metallic layer of a first material arranged on said contact area; and
    a second metallic layer, thicker than said first metallic layer, of a second material disposed on said first metallic layer in a wafer;
    the method comprising the steps of:
    applying said at least one first thin metallic layer on said at least one contact area of the power semiconductor components;
    arranging a pasty layer including the second material and a solvent, on at least one of said first metallic layers for each power semiconductor component;
    pressurizing said pasty layer; and
    singulating the semiconductor components;
    whereby said second metallic layer is capable of reducing mechanical stresses applied to the power semiconductor component.

2. The method of claim 1, wherein the pasty layer is applied by means of a stencil printing method.

3. The method of claim 1, wherein said pressure is applied by means of a press and two pressing rams, wherein at least one pressing ram is formed with a quasi-hydrostatic pressure generating silicone pad arranged thereon.

4. The method of claim 1, wherein said pressure is formed in an externally pressurized pressure tank filled with a fluid and the power semiconductor components in said wafer are arranged completely in said pressure tank.

5. The method of claim 1, wherein the maximum final pressure during the pressurization is at least approximately 15 MPa.

6. The method of claim 1, further comprising the step of heating said power semiconductor components to more than about 350° K during pressurization.

7. The method of claim 1, further comprising the step of covering at least one of said pasty layer and said entire wafer with a film prior to pressurization.

* * * * *